(12) United States Patent
Kim et al.

(10) Patent No.: US 9,424,894 B2
(45) Date of Patent: Aug. 23, 2016

(54) SIGNAL TRANSFER CIRCUIT AND OPERATING METHOD THEREOF

(71) Applicant: SK hynix Inc., Gyeonggi-do (KR)

(72) Inventors: Youk-Hee Kim, Gyeonggi-do (KR); Yong-Ju Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 63 days.

(21) Appl. No.: 14/505,115

(22) Filed: Oct. 2, 2014

(65) Prior Publication Data

US 2015/0288350 A1 Oct. 8, 2015

(30) Foreign Application Priority Data

Apr. 4, 2014 (KR) .......................... 10-2014-0040561

(51) Int. Cl.
*H03K 3/00* (2006.01)
*G11C 7/10* (2006.01)

(52) U.S. Cl.
CPC .............. *G11C 7/1078* (2013.01); *G11C 7/106* (2013.01); *G11C 7/1084* (2013.01); *G11C 7/1087* (2013.01)

(58) Field of Classification Search
CPC ..................................................... G11C 7/1078
See application file for complete search history.

(56) References Cited

U.S. PATENT DOCUMENTS

2015/0236676 A1* 8/2015 Cai ..................... H03K 3/356
327/212

FOREIGN PATENT DOCUMENTS

KR 1020120054824 5/2012

* cited by examiner

*Primary Examiner* — Daniel Puentes
(74) *Attorney, Agent, or Firm* — IP & T Group LLP

(57) ABSTRACT

A signal transfer circuit includes a signal input unit suitable for generating an input signal corresponding to a first voltage level and a second voltage level, a transfer control unit suitable for controlling a driving path of a transfer node in response to a control signal and selectively driving the transfer node to the second voltage level or a third voltage level, which is higher than the first voltage level, based on the driving path in response to the input signal, and an output control unit suitable for outputting an output signal by driving an output node based on a voltage level of the transfer node or maintaining a previous voltage level of the output node in response to the control signal.

19 Claims, 3 Drawing Sheets

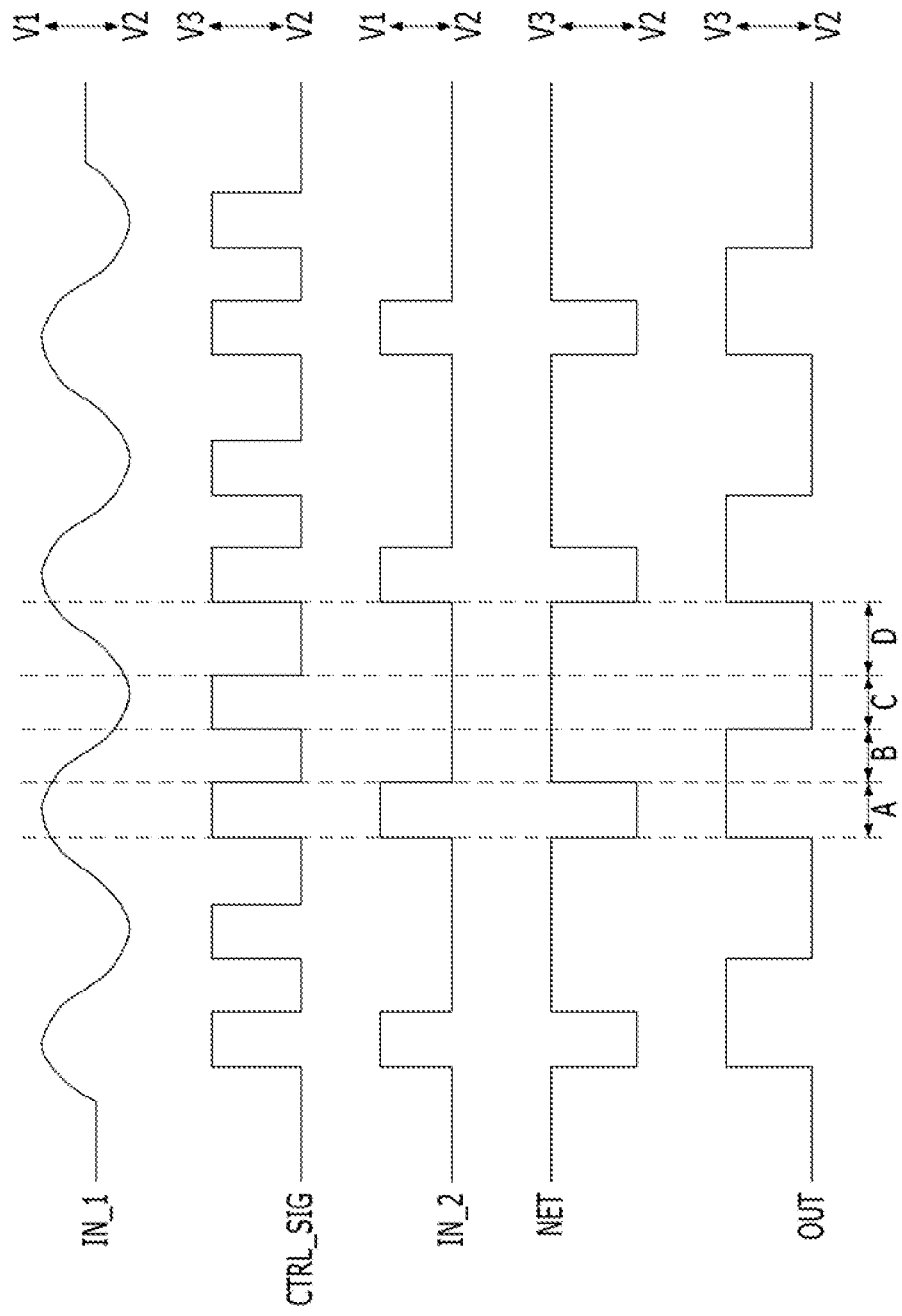

SIGNAL TRANSFER CIRCUIT AND OPERATING METHOD THEREOF

CROSS-REFERENCE TO RELATED APPLICATIONS

The present application claims priority of Korean Patent Application No. 10-2014-0040561, filed on Apr. 4, 2014, which is incorporated herein by reference in its entirety.

BACKGROUND

1. Field

Exemplary embodiments of the present invention relate to a signal transfer circuit and an operating method thereof for transferring a signal through a plurality of signal transmission lines.

2. Description of the Related Art

In general, as technology has developed, the semiconductor memory device industry has been challenged to increase operating speed and reduce power consumption.

Semiconductor memory devices output or receive numerous bits of data. For example, 16, 32, or 64 bits of data may be transferred simultaneously to improve memory device and system performance. In order to output multiple bits of data simultaneously, a circuit including a data output buffer and a data transmission line corresponding to each output bit is needed.

When data is transferred in a semiconductor memory device, a signal having a full swing between a power supply voltage and a ground voltage is transferred through a data transmission line. Since the semiconductor memory device includes a large number of data transmission lines, current consumption may increase when the data is transferred through the data transmission lines. As the size of a semiconductor memory device increases, the number of data transmission lines increases. Since the data transmission lines are disposed in a peripheral region of the semiconductor memory device, line loading elements are increased. Furthermore, since data having a full swing is transferred through the data transmission lines, the line loading elements are further increased. The line loading elements of the data transmission line may block high speed transfer operations of data and increase current consumption when data is transferred through a data transmission line.

SUMMARY

Exemplary embodiments of the present invention are directed to a signal transfer circuit and an operating method thereof for reducing current consumption of signal transmission lines by lowering signal voltage level.

In accordance with an exemplary embodiment of the present invention, a signal transfer circuit may include a signal input unit suitable for generating an input signal corresponding to a first voltage level and a second voltage level, a transfer control unit suitable for controlling a driving path of a transfer node in response to a control signal and selectively driving the transfer node to the second voltage level or a third voltage level higher than the first voltage level based on the driving path in response to the input signal, and an output control unit suitable for outputting an output signal by driving an output node based on a voltage level of the transfer node or maintaining a previous voltage level of the output node in response to the control signal.

The transfer control unit may pull-up-drive the transfer node to the third voltage level while cutting off a pull-down path of the transfer node, when the control signal is deactivated, and the transfer control unit may cut off the pull-down path, or pull-down-drives the transfer node to the second voltage level in response to the input signal while cutting off a pull-up path of the transfer node, when the control signal is activated.

The first voltage level may be lower than a power supply voltage level, and the second voltage level may be a ground voltage level, and the third voltage level may be the power supply voltage level.

The signal input unit may include an input driving unit suitable for receiving an initial input signal and driving a first input node; and an input transfer unit suitable for transferring a signal corresponding to a voltage level of the first input node as the input signal in response to the control signal.

The transfer control unit may include a pull-down driving unit suitable for pull-down-driving the transfer node to the second voltage level when the input signal has the first voltage level, and cutting off a pull-down driving of the transfer node when the input signal has the second voltage level, a level initializing unit suitable for initializing the input signal to the second voltage level when the control signal is deactivated, and a pull-up driving unit suitable for pull-up-driving the transfer node to the third voltage level when the control signal is deactivated.

The transfer node may maintain a present voltage level thereof when the control signal is activated and the pull'-down driving of the transfer node is cut off.

The output control unit may include an output driving unit suitable for driving the output node by inverting the voltage level of the transfer node, and a signal output unit suitable for outputting the output signal corresponding to a voltage level of the output node when the control signal is activated, and outputting the output signal corresponding to the previous voltage level of the output node irrespective of the voltage level of the transfer node when the control signal is deactivated.

The signal output unit may include an output transfer unit suitable for determining whether to transfer a signal of the output node as the output signal in response to the control signal, and an output latch unit suitable for latching a signal transferred from the output transfer unit, wherein when the control signal is activated, the signal output unit outputs the signal transferred from the output transfer unit, as the output signal, and when the control signal is deactivated, the signal output unit outputs a latched signal of the output latch unit as the output signal.

The input driving unit may include a first NMOS transistor suitable for forming a source-drain path between a power supply voltage terminal and the first input node, and receiving the initial input signal through a gate thereof, and a second NMOS transistor suitable for forming a source-drain path between the first input node and a ground voltage terminal, and receiving an inverted signal of the initial input signal through a gate thereof, wherein the input driving unit transfers a signal of the first input node, which is transferred through the first NMOS transistor and the second NMOS transistor, to the input transfer unit.

The pull-up driving unit may include a first PMOS transistor, which forms a source-drain path between a power supply voltage terminal and the transfer node, and receives the control signal through a gate thereof.

The pull-down driving unit may include a third NMOS transistor, which forms a source-drain path between a ground voltage terminal and the transfer node, and receives the input signal through a gate thereof.

The level initializing unit may include a fourth NMOS transistor, which forms a source-drain path between a second input node and a ground voltage terminal, and receives an inverted single of the control signal through a gate thereof.

The output driving unit may include a second PMOS transistor suitable for forming a source-drain path between a power supply voltage terminal and the output node, and receiving a signal of the transfer node through a gate thereof, a fifth NMOS transistor suitable for forming a source-drain path between a ground voltage terminal and the output node, and receiving the signal of the transfer node through a gate thereof.

In accordance with another exemplary embodiment of the present invention, an operating method of a signal transfer circuit may include generating an input signal corresponding to a first voltage level and a second voltage level, pull-up-driving a transfer node to a third voltage level higher than the first voltage level while cutting off a pull-down driving path of the transfer node when a control signal is deactivated, cutting off the pull-down driving path, or pull-down-driving the transfer node to the second voltage level in response to the input signal while cutting off a pull-up driving path of the transfer node when the control signal is activated, determining a voltage level of an output node by inverting and driving a voltage level of the transfer node when the control signal is activated, and maintaining the voltage level of the output node irrespective of the voltage level of the transfer node when the control signal is deactivated.

The first voltage level may be lower than a power supply voltage level, and the second voltage level may be a ground voltage level, and the third voltage level may be the power supply voltage level.

The cutting off of the pull-down driving path, or the pull-down-driving of the transfer node may include pull-down-driving the transfer node to the second voltage level when the input signal is the first voltage level, and cutting off the pull-down driving path of the transfer node when the input signal is the second voltage level.

The pull-up-driving of the transfer node may include initializing the input signal to the second voltage level, and cutting off the pull-down driving path of the transfer node in response to an initialized input signal.

The voltage level of the output node may be latched in the determining of the voltage level of the output node and a latched voltage level of the output node may be outputted in the maintaining of the voltage level of the output node.

In accordance with another exemplary embodiment of the present invention, an operating method of a signal transfer circuit may include receiving an input signal corresponding to a first voltage level and a second voltage level through an input node, pull-up-driving an output node to a third voltage level higher than the first voltage level when the input signal is sampled as the first voltage level during an activation period of a control signal, pull-down-driving the output node to the second voltage level when the input signal is sampled as the second voltage level during the activation period of the control signal, maintaining the output node to the third voltage level during an deactivation period of the control signal after the pull-up-driving of the output node, and maintaining the output node to the second voltage level during the deactivation period of the control signal after the pull-down-driving of the output node.

The method may further include cutting off a pull-down-driving path of the output node during the pull-up-driving of the output node, and cutting off a pull-up-driving path of the output node during the pull-down-driving of the output node.

BRIEF DESCRIPTION OF THE DRAWINGS

FIG. 3 is a timing diagram of a signal transfer circuit in accordance with an exemplary embodiment of the present invention.

DETAILED DESCRIPTION

Figure 1:
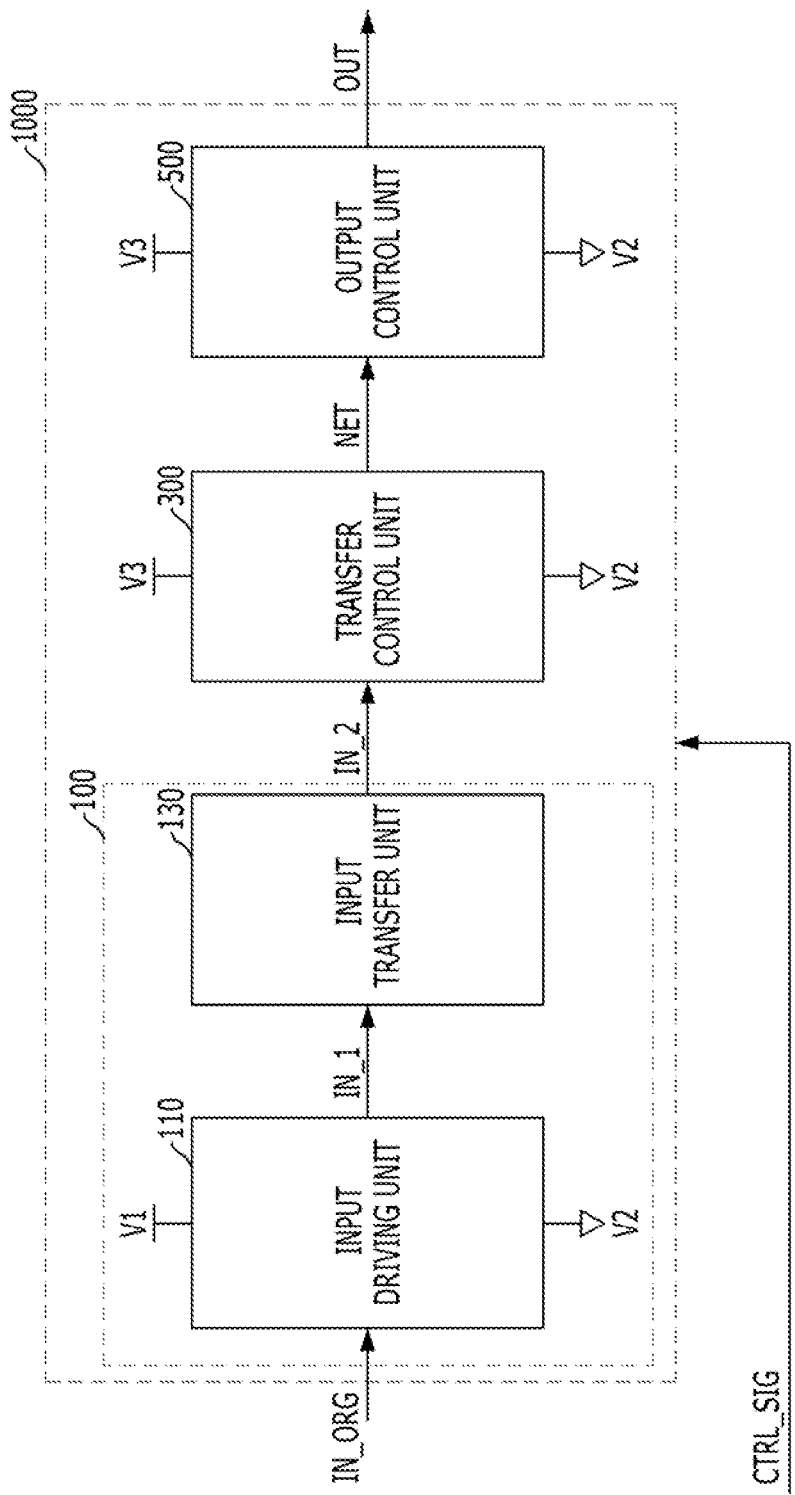
FIG. 1 is a circuit diagram illustrating a signal transfer circuit in accordance with an exemplary embodiment of the present invention.

Exemplary embodiments of the present invention will be described below in more detail with reference to the accompanying drawings. The present invention may however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' presents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a circuit diagram illustrating a signal transfer circuit in accordance with an exemplary embodiment of the present invention.

Referring to FIG. 1, a signal transfer circuit 1000 in accordance with an exemplary embodiment of the present invention may include a signal input unit 100, a transfer control unit 300 and an output control unit 500.

The signal input unit 100 may include an input driving unit 110 and an input transfer unit 130. The signal input unit 100 generates an input signal IN_2 corresponding to a first voltage level V1 and a second voltage level V2. A transfer signal IN_1 outputted from the input driving unit 110 is transferred as the input signal IN_2 through the input transfer unit 130. The transfer signal IN_1 has a small swing level between the first voltage level V1 and the second voltage level V2 and is transferred to the transfer control unit 300 through transmission lines.

The transfer control unit 300 pull-down-drives a transfer node to the second voltage level V2 or pull-up-drives the transfer node to a third voltage level V3 higher than the first voltage level V1 by controlling a driving path of the transfer node in response to a control signal CTRL_SIG. More specifically, if the control signal CTRL_SIG is activated, the transfer control unit 300 cuts off a pull-up driving path of the transfer node. While cutting off the pull-up driving path of the transfer node, the transfer control unit 300 cuts off a pull-down driving path or pull-down-drives the transfer node to the second voltage level V2 in response to the input signal IN_2. Also if the control signal CTRL_SIG is deactivated, the transfer control unit 300 pull-up-drives the transfer node to the third voltage level V3 higher than the first voltage level V1 while cutting off the pull-down driving path of the transfer node.

The output control unit 500 outputs a previous voltage level or drives an output node based on a voltage level of the transfer node in response to the control signal CTRL_SIG. The first voltage level V1 may be lower than a power supply voltage VDD, and the second voltage level V2 may be a ground voltage VSS, and the third voltage level V3 may be the power supply voltage VDD. The control signal CTRL_SIG may be generated internally. For example, if a command is set by a mode register set (MRS), a read command synchronized with a clock signal is applied to a semiconductor memory device (not shown), and the control signal CTRL_SIG may be generated after a predetermined time elapses based on CAS latency and burst length.

In a general signal transfer circuit, when a signal having a full swing level is transferred through a plurality of signal transmission lines current consumption is increased. On the other hand, the signal transfer circuit 1000 in accordance with an exemplary embodiment of the present invention receives an initial input signal IN_ORG having a full swing level, converts the initial input signal IN_ORG into the transfer signal IN_1 having a small swing level, and transfers the transfer signal IN_1 as the input signal IN_2 in response to the control signal CTRL_SIG. Thus, since a signal having a small swing level is transferred through a plurality of transmission lines, current consumption may be reduced when the signal is transferred. Moreover, since the signal transfer circuit 1000 converts the input signal IN_2 having the small swing level into a signal having a full swing level and then outputs the converted signal having the full swing level in response to the control signal, which is generated internally, an additional converting circuit is not needed.

Hereinafter, a configuration and an operation of the signal transfer circuit will be described in detail with reference to FIG. 2.

Figure 2:
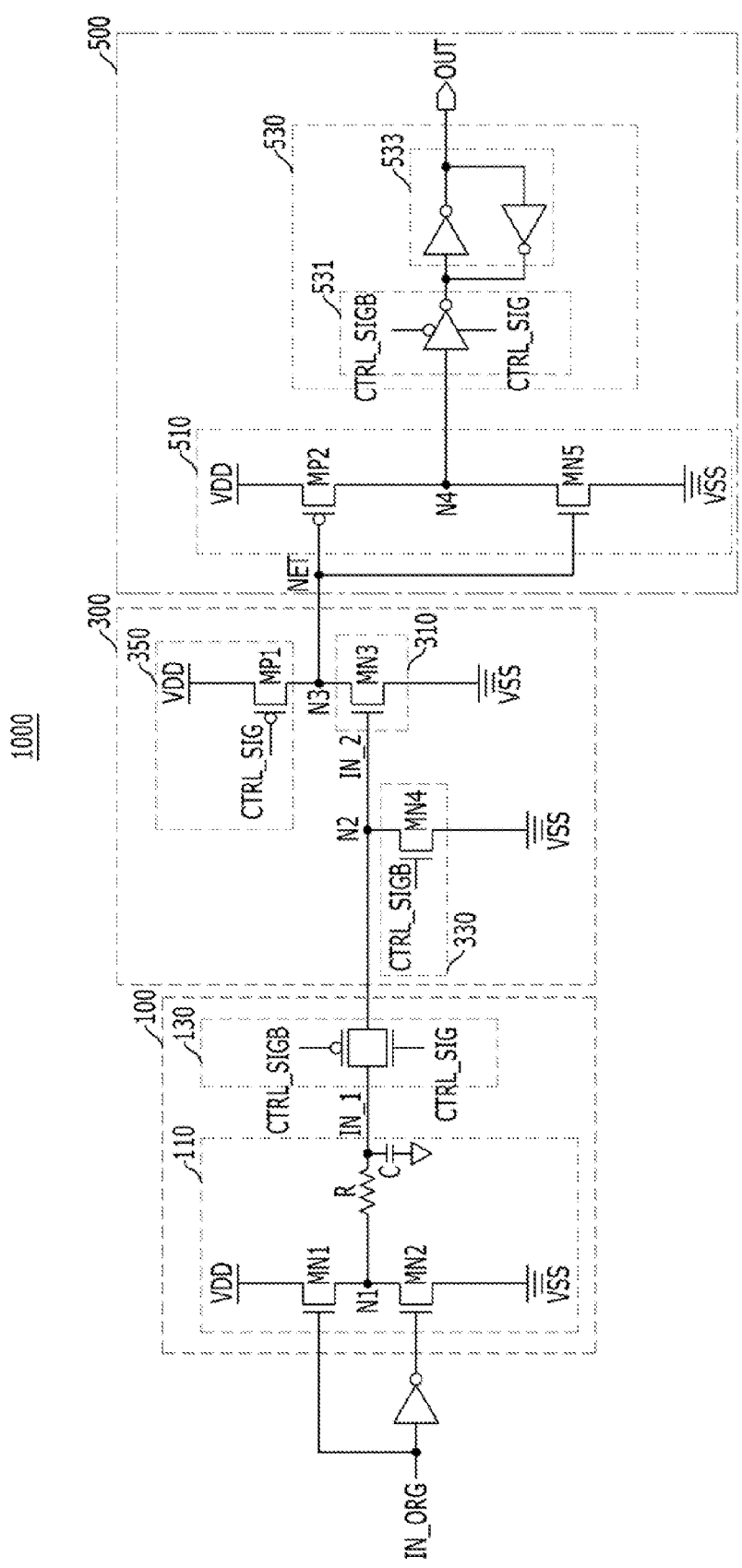
FIG. 2 is a detailed circuit diagram illustrating the signal transfer circuit shown in FIG. 1.

FIG. 2 is a detailed circuit diagram illustrating the signal transfer circuit shown in FIG. 1.

Referring to FIG. 2, the signal transfer circuit 1000 may include the signal input unit 100, the transfer control unit 300 and the output control unit 500.

The signal input unit 100 includes the input driving unit 110 and the input transfer unit 130.

The input driving unit 110 drives a first input node N1 in response to the initial input signal IN_ORG. The input driving unit 110 includes a first NMOS transistor MN1 and a second NMOS transistor MN2. The first NMOS transistor MN1 forms a source-drain path between the first input node N1 and a power supply voltage terminal to which a power supply voltage VDD is supplied. The first NMOS transistor MN1 receives the initial input signal IN_ORG through a gate thereof. The second NMOS transistor MN2 forms a source-drain path between the first input node N1 and a ground voltage terminal to which a ground voltage VSS is supplied. The second NMOS transistor MN2 receives an inverted initial input signal through a gate thereof.

If the initial input signal IN_ORG having a power supply voltage level VDD is applied, the first NMOS transistor MN1 is turned on, and the second NMOS transistor MN2 is turned off. Thus, a current path may be formed between the power supply voltage terminal and the first input node N1. The first input node N1 may have a first voltage level corresponding to a current that flows on the first NMOS transistor MN1. The first voltage level may be a voltage level VDD-VTH reduced from the power supply voltage level VDD by a threshold voltage level VTH.

Moreover, if the initial input signal IN_ORG having a ground voltage level VSS is applied, the second NMOS transistor MN2 is turned on and the first NMOS transistor MN1 is turned off. Thus, a current path may be formed between the first input node N1 and the ground voltage terminal. The first input node N1 may have a second voltage level corresponding to a current that flows on the second NMOS transistor MN2. The second voltage level may be the ground voltage level VSS. In other words, the input driving unit 110 may generate the transfer signal IN_1 having a swing level between the first voltage level VDD-VTH and the second voltage level VSS in response to the initial input signal IN_ORG having a swing level between the power supply voltage level VDD and the ground voltage level VSS.

The input transfer unit 130 may transfer the transfer signal IN_1, which corresponds to a voltage level of the first input node N1, as the input signal IN_2 to a second input node N2 in response to the control signal CTRL_SIG. The input transfer unit 130 may be a pass gate including an NMOS transistor and a PMOS transistor. The pass gate transfers the transfer signal IN_1 as the input signal IN_2 if the control signal CTRL_SIG has a logic high level, and the pass gate cuts off the transfer signal IN_1 if the control signal CTRL_SIG has a logic low level. In another embodiment of the present invention, the input transfer unit 130 may include a circuit for transferring a signal on the first input node N1 to the second input node N2 based on a logic level of the control signal CTRL_SIG.

Meanwhile, a resistor R and a capacitor C for performing a function of a low pass filter (LPF) may be formed between the input driving unit 110 and the input transfer unit 130. Through the resistor R and the capacitor C, a DC component having a low frequency is transferred, and an AC component having a high frequency is removed. Thus, a signal on the first input node N1 may be the transfer signal IN_1 having a swing level due to loading of a plurality of transmission lines. The transfer signal IN_1 is transferred to the input transfer unit 130, and is selectively transferred to the second input node N2 in response to the control signal CTRL_SIG.

The transfer control unit 300 may include a pull-down driving unit 310, a level initializing unit 330 and a pull-up driving unit 350.

The pull-down driving unit 310 pull-down-drives a transfer node N3 to a second voltage level, e.g., a ground voltage level VSS if a voltage level of the second input node N2 is the first voltage level VDD-VTH. The pull-down driving unit 310 cuts off a pull-down operation on the transfer node N3 if the voltage level of the second input node N2 is the second voltage level VSS. The pull-down driving unit 310 includes a third NMOS transistor MN3, which forms a source-drain path between the transfer node N3 and the power supply voltage terminal and receives the input signal IN_2 on the second input node N2 through a gate.

The level initializing unit 330 may be located between the input transfer unit 130 and the pull-down driving unit 310. The level initializing unit 330 initializes the second input node N2 to the second voltage level VSS when the control signal CTRL_SIG is deactivated. A pull-down driving path of the transfer node N3 may be cut off in response to the initialized level of the second input node N2. The level initializing unit 330 may include a fourth NMOS transistor MN4 which forms a source-drain path between the second input node N2 and the ground voltage terminal and receives an inverted control signal CTRL_SIGB through a gate.

The pull-up driving unit 350 pull-up-drives the transfer node N3 to a third voltage level, e.g., VDD, in response to the control signal CTRL_SIG. The pull-up driving unit 350 may include a first PMOS transistor MP1, which forms a source-drain path between the power supply voltage terminal and the transfer node N3 and receives the control signal CTRL_SIG through a gate.

Hereinafter, an operation of the transfer control unit 330 will be described as below.

If the first voltage level VDD-VTH or the second voltage level VSS of the transfer signal IN_1 is transferred to the second input node N2, the pull-down driving unit 310 is driven depending on the voltage level of the second input node N2. If the second input node N2 has the first voltage level VDD-VTH, the third NMOS transistor MN3 is turned on and a current path may be formed between the ground voltage terminal VSS and the transfer node N3. If the second input node N2 has the second voltage level VSS, the third NMOS transistor MN3 is turned off, and the pull-up driving unit 350 and the level initializing unit 330 are not driven in response to the control signal CTRL_SIG, which is activated. Thus the transfer node N3 becomes a floating state in which no current path is formed. That is, the transfer node N3 maintains a voltage lever of the present state when the control signal CTRL_SIG is activated and the pull-down operation of the transfer node N3 is cut off.

If the control signal CTRL_SIG is deactivated to a logic low level, the pull-up driving unit 350 and the level initializing unit 330 may be driven. Thus, the second input node N2 has the second voltage level VSS by the level initializing unit 330. The driving operation of the pull-down driving unit 330 may be cut off, and the transfer node N3 is pulled-up-driven by the pull-up driving unit 350 in response to the control signal CTRL_SIG having the logic low level. Thus, the first PMOS transistor MP1 is turned on, and the current path may be formed between the power supply terminal and the transfer node N3.

The output control unit 500 may drive an output node N4 in response to a voltage level of the transfer node N3 when the control signal CTRL_SIG is activated. The output control unit 500 may determine a voltage level of an output node N4 by inverting and driving the voltage level of the transfer node N3 when the control signal CTRL_SIG is activated. The output control unit 500 may maintain the voltage level of the output node N4 irrespective of the voltage level of the transfer node N3 when the control signal CTRL_SIG is deactivated.

More specifically, the output control unit 500 may include an output driving unit 510 and a signal output unit 530.

The output driving unit 510 drives the voltage level of the output node N4 in response to the voltage level of the transfer node N3. The output driving unit 510 may include a second PMOS transistor MP2 and a fifth NMOS transistor MN5. The second PMOS transistor MP2 forms a source-drain path between the power supply voltage terminal and the output node N4, and receives the signal on the transfer node N3 through a gate thereof. The fifth NMOS transistor MN5 forms a source-drain path between the output node N4 and the ground voltage terminal, and receives the signal on the transfer node N3 through a gate thereof. If the signal on the transfer node N3 has a logic high level, the fifth NMOS transistor MN5 is turned on, and if the signal on the transfer node N3 has a logic low level, the second PMOS transistor MP2 is turned on.

The signal output unit 530 may output a signal corresponding to a voltage level of the output node N4 in response to the control signal CTRL_SIG when the control signal CTR_SIG is activated. The signal output unit 530 maintains and outputs a signal corresponding to a previous voltage level of the output node N4 irrespective of the voltage level of the transfer node N3 when the control signal CTRL_SIG is deactivated. The previous voltage level of the output node N4 may represent a voltage level that is determined when the control signal CTRL_SIG is activated.

The signal output unit 530 may include an output transfer unit 531 and an output latch unit 533. The output transfer unit 531 determines an output of the signal corresponding to the output node N4 in response to the control signal CTRL_SIG. The output latch unit 533 latches the signal transferred from the output transfer unit 531. That is, the output latch unit latches the signal transferred from the output transfer unit 531 and outputs a latched signal as an output signal OUT when the control signal CTRL_SIG is activated. The output latch unit 533 outputs a previously latched signal as the output signal OUT when the control signal CTRL_SIG is deactivated. The previous latched signal represents the signal determined when the control signal CTRL_SIG is activated.

Hereinafter, an operation of the signal transfer circuit 1000 will be described below.

<A Case in which an Initial Input Signal IN_ORG has a High Logic Level.>

If the initial input signal IN_ORG having a logic high level is applied to the input driving unit 110, the first NMOS transistor MN1 is turned on, and the first input node N1 has the first voltage level VDD-VTH. If the control signal CTRL_SIG is activated, the input transfer unit 130 may transfer the transfer signal IN_1 corresponding to the voltage level of the first input node N1 to the second input node N2. The input signal IN_2 corresponding to the first voltage level VDD-VTH of the second input node N2 is applied to the third NMOS transistor MN3 and the third NMOS transistor MN3 is driven. Thus, the transfer node N3 is pull-down-driven to the second voltage level VSS. The signal NET corresponding to the second voltage level VSS of the transfer node N3 is applied to the output driving unit 510, and the second PMOS transistor MP2 is driven. The output node N4 is pull-up-driven to the third voltage level VDD. The signal of the output node N4 is applied to the output transfer unit 531 and is inverted and outputted as the second voltage level VSS. The signal outputted from the output transfer unit 531 is applied to and latched by the output latch unit 533. The latched signal is inverted and outputted as the output signal OUT having the third voltage level VDD.

If the control signal CTRL_SIG is deactivated, the input transfer unit 130 is disabled, and the fourth NMOS transistor MN4 is turned on, and the second input node N2 is pull-down-driven to the second voltage level VSS. Also, if the control signal CTRL_SIG is deactivated, the first PMOS transistor MP1 is turned on, and the transfer node N3 is pulled-up-driven to the third voltage level VDD. The signal NET corresponding to the third voltage level VDD of the transfer node N3 is applied to the output driving unit 510, and the fifth NMOS transistor MN5 is turned on, and the output node N4 is pull-down-driven to the second voltage level VSS. However, the output transfer unit 531 is not driven in response to the control signal CTRL_SIG, which is deactivated. Thus, the signal of the third voltage level VDD, which is previously latched in the output latch unit 533, may be outputted as the output signal OUT.

<A Case in which the Initial Input Signal IN_ORG has a Logic Low Level>

If the initial input signal IN_ORG having a logic low level is applied to the input driving unit 110, the first NMOS transistor MN1 is turned off, and the second NMOS transistor MN2 is turned on in response to an inverted initial input signal. The first input node N1 is pull-down-driven by the second NMOS transistor MN2 and has the second voltage level VSS. If the control signal CTRL_SIG is activated, the transfer signal IN_1 corresponding to the voltage level of the first input node N1 is transferred to the second input node N2 in response to the control signal CTRL_SIG. The input signal IN_2 corresponding to the second voltage level VSS of the second input node N2 is applied to the third NMOS transistor MN3, and the third NMOS transistor MN3 is turned off, and the first PMOS transistor MP1 is turned off in response to the control signal CTRL_SIG. Thus, the first PMOS transistor MP1 and the third NMOS transistor MN3 are turned off, and the transfer node N3 may be in a floating state. Since a current path is not formed on the transfer node N3, the signal NET corresponding to the previous voltage level, e.g., the third voltage level VDD, may be applied to the second PMOS transistor MP2 and the fifth MOS transistor MN5. The second PMOS transistor MP2 is turned off and the fifth NMOS transistor MN5 is turned on. The output node N4 may be pull-down-driven to the second voltage level VSS. The signal of the output node N4 having the second voltage level VSS is applied to the output transfer unit 531 and is inverted. The output transfer unit 531 may output a signal having the third voltage level VDD. The signal outputted from the output transfer unit 531 is applied to and latched by the output latch unit 533. A latched signal is inverted and is outputted as the output signal OUT having the second voltage level VSS.

If the control signal CTRL_SIG is deactivated, the input transfer unit 130 is disabled, and the fourth NMOS transistor MN4 of the level initializing unit 330 is turned on, and the second input node N2 has the second voltage level VSS. If the control signal CTRL_SIG is deactivated, the first PMOS transistor MP1 is turned on, and the transfer node N3 is pull-up-driven to the third voltage level VDD. The signal NET corresponding to the third voltage level VDD of the transfer node N3 is applied to the fifth NMOS transistor MN5 of the output driving unit 510. The fifth NMOS transistor MN5 is turned on and the output node N4 is pull-down-driven to the second voltage level VSS. However, the output transfer unit 531 is not driven in response to the control signal CTRL_SIG, which is deactivated. Thus, the signal having the second voltage level VSS, which is previously latched in the output latch unit 533, is outputted as the output signal OUT.

The signal transfer circuit in accordance with an exemplary embodiment of the present invention may reduce current consumption caused by a signal transfer operation since the initial input signal IN_ORG having a full swing level is converted into a signal having a small swing level and is transferred through signal transmission lines. When the input signal IN_2 having a small swing level is transferred using the control signal CTRL_SIG, the pull-down driving unit 310 may be completely turned off. Moreover, the voltage level of the transfer node N3 may be driven to the third voltage level using the control signal CTRL_SIG, which is generated internally. Thus, since the signal having the small swing level, which is transferred using the control signal CTRL_SIG, is converted into the signal having the full swing level in the signal transfer circuit, an additional conversion circuit for the signal having the full swing level may be not needed. Thus, the area of the signal transfer circuit is not increased.

FIG. 3 is a timing diagram of a signal transfer circuit in accordance with an exemplary embodiment of the present invention.

Referring to FIG. 3, signals corresponding to the voltage levels of respective nodes of the signal transfer circuit 1000 shown in FIG. 2 are shown in FIG. 3. The transfer signal IN_1 corresponding to the first input node N1 may be transferred through a transmission line, swinging between the first voltage level V1 and the second voltage level V2. The control signal CTRL_SIG is synchronized and generated with a clock signal of a semiconductor memory device. The control signal CTRL_SIG may have a voltage level between the second voltage level V2 and the third voltage level V3. The input signal IN_2 of the second input node N2 may have a voltage level between the first voltage level V1 and the second voltage level V2 since the transfer signal IN_1 of the first input node N1 is transferred as the input signal IN_2. The signal NET of the transfer node N3 may have a voltage level between the second voltage level V2 and the third voltage level V3. The output signal OUT may have a voltage level between the second voltage level V2 and the third voltage level V1 As described above, the first voltage level V1 may indicate a voltage level that is reduced from the power supply voltage level VDD by the threshold voltage level VTH. The second voltage level may indicate the ground voltage level VSS, and the third voltage level may indicate the power supply voltage level VDD.

Operation periods, e.g., 'A', 'C' and 'D', of the signal transfer circuit will be described as below.

The 'A' period represents a period when the transfer signal IN_1 of the first input node N1 has a logic high level and the control signal CTRL_SIG has a logic high level. While the pull-up driving path of the transfer node N3 is cut off, the transfer node N3 is pull-down-driven to the second voltage level V2 in response to the input signal IN_2 of the second input node N2. The signal NET of the transfer node N3 becomes a logic low level. The output node N4 is pull-up-driven to the third voltage level V3 in response to the signal NET of the transfer node N3 having the logic low level, and the output signal OUT has a logic high level.

The 'B' period represents a period when the control signal CTRL_SIG has a logic low level. While the pull-down path of the transfer node N3 is cut off, the transfer node N3 is pull-up-driven to the third voltage level V3, and the signal NET of the transfer node N3 has a logic high level. The output node N4 is pull-down-driven to the second voltage level V2 in response to the signal NET of the transfer node N3 having the logic high level. However, since the control signal CTRL_SIG has a logic low level, the output signal OUT maintains the logic high level, which is previously outputted.

The 'C' period represents a period when the control signal CTRL_SIG has a logic high level and the transfer signal IN_1 of the first input node N1 has the logic low level. The input signal IN_2 of the second input node N2, which is transferred from the transfer signal IN_1 of the first input node N1, has the logic low level. While the pull-up driving path is cut off, the pull-down driving of the transfer node N3 is disabled in response to the input signal IN_2 of the second input node N2 having the logic low level. Thus, the signal NET of the transfer node N3 maintains the logic high level, which is previously outputted. The output node N4 is pull-down-driven to the second voltage level V2 in response to the signal NET of the transfer node N3 having the logic high level, and the output signal OUT has the logic low level.

The 'D' period represents a period when the control signal CTRL_SIG has a logic low level. While the pull-down driving path of the transfer node N3 is cut off, the transfer node N3 is pull-up-driven to the third voltage level V3, and the signal NET of the transfer node N3 has the logic high level. However, since the control signal CTRL_SIG has the logic low level, the output signal OUT maintains the logic low level, which is previously outputted.

In other words, the 'A' period is an activation period of the control signal CTRL_SIG. When the transfer signal IN_1 of the first input node N1 is sampled as the first voltage level V1, the output node N4 is pull-up-driven to the third voltage level V3. The output signal OUT has the third voltage level V3. The 'B' period is a deactivation period of the control signal CTRL_ SIG. The output signal OUT maintains the third voltage level V3. The 'C' period is an activation period of the control signal CTRL_SIG. When the transfer signal IN_1 of the first input node N1 is sampled as the second voltage level V2, the output node N4 is pull-down-driven to the second voltage level V2. The output signal OUT has the second voltage level V2. The 'D' period is a deactivation period of the control signal CTRL_SIG. The output signal OUT maintains the second voltage level V2.

Thus, when the control signal CTRL_SIG is activated during the 'A' period and the 'C' period, the output signal OUT is sampled in response to the transfer signal IN_1 of the first input node N1. Moreover, when the control signal CTRL_ SIG is deactivated during the 'B' period and the 'D' period, the output signal OUT maintains a previous voltage level irrespective of the voltage level of the transfer node N3.

The signal transfer circuit in accordance with an exemplary embodiment of the present invention may reduce current consumption by converting a signal having a full swing level into a signal having a small swing level and transferring a converted signal, Moreover, since a signal having a small swing level converted into a signal having a full swing level using a control signal generated internally, an additional circuit for level conversion is not needed, and the area of the signal transfer circuit may be reduced.

While the present invention has been described with respect to the specific embodiments, it will be apparent to those skilled in the art that various changes and modifications may be made without departing from the spirit and scope of the invention as defined in the following claims.

What is claimed is:

1. A signal transfer circuit, comprising:
    a signal input unit suitable for generating an input signal corresponding to a first voltage level and a second voltage level;
    a transfer control unit suitable for controlling a driving path of a transfer node in response to a control signal and selectively driving the transfer node to the second voltage level or a third voltage level, which is higher than the first voltage level, based on the driving path in response to the input signal; and
    an output control unit suitable for outputting an output signal by driving an output node based on a voltage level of the transfer node or maintaining a previous voltage level of the output node in response to the control signal,
    wherein the signal input unit includes:
        an input driving unit suitable for receiving an initial input signal and driving a first input node by the first voltage level or the second voltage level; and
        an input transfer unit suitable for transferring a signal corresponding to a voltage level of the first input node as the input signal in response to the control signal.

2. The signal transfer circuit of claim 1, wherein the transfer control unit pull-up-drives the transfer node to the third voltage level while cutting off a pull-down path of the transfer node, when the control signal is deactivated, and the transfer control unit cuts off the pull-down path or pull-down-drives the transfer node to the second voltage level in response to the input signal while cutting off a pull-up path of the transfer node, when the control signal is activated.

3. The signal transfer circuit of claim 1, wherein the first voltage level is lower than a power supply voltage level, and the second voltage level is a ground voltage level, and the third voltage level is the power supply voltage level.

4. The signal transfer circuit of claim 1, wherein the transfer control unit includes:
    a pull-down driving unit suitable for pull-down-driving the transfer node to the second voltage level when the input signal has the first voltage level, and cutting off pull-down driving of the transfer node when the input signal has the second voltage level;
    a level initializing unit suitable for initializing the input signal to the second voltage level when the control signal is deactivated; and
    a pull-up driving unit suitable for pull-up-driving the transfer node to the third voltage level when the control signal is deactivated.

5. The signal transfer circuit of claim 4, wherein the transfer node maintains a present voltage level thereof when the control signal is activated and the pull-down driving of the transfer node is cut off.

6. The signal transfer circuit of claim 1, wherein the output control unit includes:
    an output driving unit suitable for driving the output node by inverting the voltage level of the transfer node; and
    a signal output unit suitable for outputting the output signal corresponding to a voltage level of the output node when the control signal is activated, and outputting the output signal corresponding to the previous voltage level of the output node irrespective of the voltage level of the transfer node when the control signal is deactivated.

7. The signal transfer circuit of claim 6, wherein the signal output unit includes:
    an output transfer unit suitable for determining whether to transfer a signal of the output node as the output signal in response to the control signal; and
    an output latch unit suitable for latching a signal transferred from the output transfer unit,
    wherein when the control signal is activated, the signal output unit outputs the signal transferred from the output transfer unit, as the output signal, and when the control signal is deactivated, the signal output unit outputs a latched signal of the output latch unit as the output signal.

8. The signal transfer circuit of claim 1, wherein the input driving unit includes:
    a first NMOS transistor suitable for forming a source-drain path between a power supply voltage terminal and the first input node, and receiving the initial input signal through a gate thereof; and
    a second NMOS transistor suitable for forming a source-drain path between the first input node and a ground voltage terminal, and receiving an inverted signal of the initial input signal through a gate thereof,
    wherein the input driving unit transfers a signal of the first input node, which is transferred through the first NMOS transistor and the second NMOS transistor, to the input transfer unit.

9. The signal transfer circuit of claim 4, wherein the pull-up driving unit includes a first PMOS transistor, which forms a source-drain path between a power supply voltage terminal and the transfer node, and receives the control signal through a gate thereof.

10. The signal transfer circuit of claim 4, wherein the pull-down driving unit includes a third NMOS transistor, which forms a source-drain path between a ground voltage terminal and the transfer node, and receives the input signal through a gate thereof.

11. The signal transfer circuit of claim 4, wherein the level initializing unit includes a fourth NMOS transistor, which forms a source-drain path between a second input node and a ground voltage terminal, and receives an inverted signal of the control signal through a gate thereof.

12. The signal transfer circuit of claim 6, wherein the output driving unit includes:
   a second PMOS transistor suitable for forming a source-drain path between a power supply voltage terminal and the output node, and receiving a signal of the transfer node through a gate thereof; and
   a fifth NMOS transistor suitable for forming a source-drain path between a ground voltage terminal and the output node, and receiving the signal of the transfer node through a gate thereof.

13. An operating method of a signal transfer circuit, comprising:
   generating an input signal corresponding to a first voltage level and a second voltage level;
   pull-up-driving a transfer node to a third voltage level higher than the first voltage level while cutting off a pull-down driving path of the transfer node when a control signal is deactivated;
   cutting off the pull-down driving path, or pull-down-driving the transfer node to the second voltage level in response to the input signal while cutting off a pull-up driving path of the transfer node when the control signal is activated;
   determining a voltage level of an output node by inverting and driving a voltage level of the transfer node when the control signal is activated; and
   maintaining the voltage level of the output node irrespective of the voltage level of the transfer node when the control signal is deactivated,
   wherein the generating of the input signal includes:
      receiving an initial input signal and driving a first input node by the first voltage level or the second voltage level; and
      transferring a signal corresponding to a voltage level of the first input node as the input signal in response to the control signal.

14. The operating method of claim 13, wherein the first voltage level is lower than a power supply voltage level, and the second voltage level is a ground voltage level, and the third voltage level is the power supply voltage level.

15. The operating method of claim 13, wherein the cutting off of the pull-down driving path, or the pull-down-driving of the transfer node includes:
   pull-down-driving the transfer node to the second voltage level when the input signal is the first voltage level; and
   cutting off the pull-down driving path of the transfer node when the input signal is the second voltage level.

16. The operating method of claim 13, wherein the pull-up-driving of the transfer node includes:
   initializing the input signal to the second voltage level; and
   cutting off the pull-down driving path of the transfer node in response to an initialized input signal.

17. The operating method of claim 13, wherein the voltage level of the output node is latched in the determining of the voltage level of the output node and a latched voltage level of the output node is outputted in the maintaining of the voltage level of the output node.

18. An operating method of a signal transfer circuit, comprising:
   receiving an input signal corresponding to a first voltage level and a second voltage level through an input node that is driven by the first voltage level or the second voltage level;
   pull-up-driving an output node to a third voltage level higher than the first voltage level when the input signal is sampled as the first voltage level during an activation period of a control signal;
   pull-down-driving the output node to the second voltage level when the input signal is sampled as the second voltage level during the activation period of the control signal;
   maintaining the output node to the third voltage level during a deactivation period of the control signal after the pull-up-driving of the output node; and
   maintaining the output node to the second voltage level during the deactivation period of the control signal after the pull-down-driving of the output node.

19. The operating method of claim 18, further comprising:
   cutting off a pull-down-driving path of the output node during the pull-up-driving of the output node; and
   cutting off a pull-up-driving path of the output node during the pull-down-driving of the output node.

* * * * *